(12) United States Patent
Lee

(10) Patent No.: US 10,756,729 B2
(45) Date of Patent: Aug. 25, 2020

(54) ELECTRONIC RELAY DEVICE

(71) Applicant: Hyundai Mobis Co., Ltd., Seoul (KR)

(72) Inventor: Jin Woo Lee, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 0 days.

(21) Appl. No.: 16/521,646

(22) Filed: Jul. 25, 2019

(65) Prior Publication Data

US 2020/0035430 A1 Jan. 30, 2020

(30) Foreign Application Priority Data

Jul. 26, 2018 (KR) .......................... 10-2018-0087062

(51) Int. Cl.
*H03K 17/687* (2006.01)
*H03K 17/06* (2006.01)

(52) U.S. Cl.
CPC ......... *H03K 17/687* (2013.01); *H03K 17/063* (2013.01); *H03K 17/6871* (2013.01)

(58) Field of Classification Search
CPC ............... H03K 17/063; H03K 17/687; H03K 17/6871; H03K 2017/066
See application file for complete search history.

(56) References Cited

U.S. PATENT DOCUMENTS

| | | | |
|---|---|---|---|
| 9,453,886 B2* | 9/2016 | Makino | H03K 17/6871 |
| 9,515,551 B2* | 12/2016 | Lee | H02P 27/08 |
| 2020/0028503 A1* | 1/2020 | Soma | H03K 17/04123 |

FOREIGN PATENT DOCUMENTS

KR 10-2014-0073800 6/2014

* cited by examiner

*Primary Examiner* — Patrick O Neill
(74) *Attorney, Agent, or Firm* — H.C. Park & Associates, PLC

(57) ABSTRACT

An electronic relay device includes a controller configured to receive a signal from an MCU, and output an on/off control signal for switching driving; a charging unit configured to provide a driving voltage for driving a switch, in response to the control signal of the controller; the switch including first and second switching elements which supply power to a load by being on/off-controlled in response to the driving voltage from the charging unit, source terminals of the first and second switching elements being connected with each other and gate terminals of the first and second switching elements being connected with each other; and a clamping unit disposed between a source terminal and a gate terminal of the switch, and configured to constantly maintain a voltage between the source terminal and the gate terminal in an on state of the switch.

9 Claims, 3 Drawing Sheets

ELECTRONIC RELAY DEVICE

CROSS-REFERENCE TO RELATED APPLICATION

This application claims priority from and the benefit of Korean Patent Application No. 10-2018-0087062, filed on Jul. 26, 2018, which is hereby incorporated by reference for all purposes as if set forth herein.

BACKGROUND

Field

Exemplary embodiments of the disclosure relate to an electronic relay device, and more particularly, to an electronic relay device which can stably maintain a turn-on state by a clamping voltage.

Discussion of the Background

In general, a relay means a device which has a function of controlling on and off is of an electric circuit by using a predetermined electrical signal. Relays are classified into mechanical relays and electronic relays depending on an operating principle. A mechanical relay is a device of a type in which on and off of an electric circuit are controlled by using an electromagnet in such a manner that, when current flows through the electromagnet, a circuit is connected as a magnetic contact sticks to an electrode.

An electronic relay as a (non-contact) relay which removes an electrical contact by using a semiconductor element in an opening and closing part of an electrical circuit of the relay is a device of a type in which an input side and an output side configured by a semiconductor and thus having a high-load opening and closing function are disposed to be electrically isolated from each other and in which on and off of the electrical circuit are controlled as high-load current flows toward the output side when an electrical signal is applied to the input side.

The electronic relay is more widely used than the mechanical relay because it is able to control a high-load output signal even through the magnitude of an input signal is very small, has a long lifetime and high reliability due to the absence of a mechanical operating part and is not affected by a shock, a vibration, a mounting position, or the like.

FIG. 1 is a diagram illustrating a representation of an example of a conventional electronic relay circuit.

In general, in an electronic relay circuit for a vehicle, two MOSFETs (metal oxide semiconductor field effect transistors) have source terminals S which are connected with each other as illustrated in FIG. 1.

Observing the operation of a switching element of the conventional electronic relay circuit, at the time of initially turning on the respective MOSFETs with the MOSFETs being in an off state, since the voltage of the source terminals of the MOSFETs is in a floating state, the voltage of the source terminals of the MOSFETs is first grounded (GND), and a voltage is supplied to gate terminals by a charge pump circuit in preparation for grounding. After the initial turn-on, a battery voltage is supplied and thus a voltage higher by 12V than the 12V voltage of the source terminals is supplied, that is, a 24V voltage may be applied to the gate terminals to maintain the turn-on state.

However, since the conventional art has a structure in which a predetermined voltage is supplied to the gate terminals by recognizing the voltage of the source terminals of the MOSFETs, if an unstable voltage is applied to a battery input terminal after a final turn-on, the source terminal voltage may fluctuate, and the gate terminal voltage may also fluctuate. Therefore, as a voltage is not stably supplied between the gate terminals and the source terminals, relay turn-on cannot be maintained. That is to say, when a sweep of a battery voltage and a motor voltage occurs, a problem may be caused in that stable relay turn-on cannot be performed.

A background art of the disclosure is disclosed in Korean Unexamined Patent Publication No. 10-2014-0073800 (published on Jun. 17, 2014) entitled "Circuit for Electronic Relay."

The above information disclosed in this Background section is only for enhancement of understanding of the background of the invention and, therefore, it may contain information that does not constitute prior art.

SUMMARY

Exemplary embodiments are directed to an electronic relay device which does not rely on a source terminal voltage and is able to stably maintain a turn-on state by a gate terminal voltage and a clamping voltage.

In an embodiment, an electronic relay device may include: a controller configured to receive a signal from an MCU (micro controller), and output an on/off control signal for switching driving; a charging unit configured to provide a driving voltage for driving a switching unit, in response to the control signal of the controller; the switching unit including a first switching element and a second switching element which supply power to a load by being on/off-controlled in response to the driving voltage from the charging unit, source terminals of the first switching element and the second switching element being connected with each other and gate terminals of the first switching element and the second switching element being connected with each other; and a clamping unit disposed between a source terminal and a gate terminal of the switching unit, and configured to constantly maintain a voltage between the source terminal and the gate terminal in an on state of the switching unit.

The electronic relay device may further include a comparison unit configured to compare a reference voltage and a voltage of the control signal inputted from the controller, and output a signal of a corresponding state, wherein, if a turn-on signal is inputted to the controller from the MCU, as a voltage higher than the reference voltage is applied from the controller to the comparison unit, the comparison unit outputs a high (+) signal, and if a turn-off signal is inputted to the controller from the MCU, as a voltage lower than the reference voltage is applied from the controller to the comparison unit, the comparison unit outputs a low (−) signal.

The charging unit may receive a battery voltage, may pump charges, may generate a gate voltage to be applied to the switching unit, and may supply the gate voltage to a high (+) terminal of the comparison unit.

The electronic relay device may further include a first resistor disposed between an output terminal of the comparison unit and the gate terminal of the switching unit; and a is second resistor disposed between the source terminal and the gate terminal of the switching unit, and connected in parallel with the clamping unit.

In an initial off state of the switching unit, if the turn-on signal is inputted from the MCU, the high (+) signal of the comparison unit may be applied through the first resistor to the gate terminal of the switching unit, and the switching unit may be turned on as a threshold voltage is formed across the second resistor.

In a turn-on state of the switching unit, as the battery voltage is applied to the switching unit and thus the battery voltage and a voltage of the source terminal of the switching unit become the same, the high (+) signal of the comparison unit may be applied to the gate terminal of the switching unit through the first resistor, and a voltage between the source terminal and the gate terminal of the switching unit may be constantly maintained through the clamping unit, by which the turn-on state of the switching unit may be maintained.

The first switching element and the second switching element may be realized by N type MOSFETs, the drain terminal of the first switching element may be connected to a battery side, and the drain terminal of the second switching element may be connected to a load side.

The clamping unit may be formed such that two diodes are connected in series and cathodes of the respective diodes are connected in common.

In the electronic relay device according to the embodiments of the disclosure, a voltage may be stably supplied between a source terminal and a gate terminal of a switching element by a clamping voltage. As a consequence, even when there occurs disturbance such as an unstable battery voltage, a turn-on state of the switching element may be stably maintained without relying on a source terminal voltage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
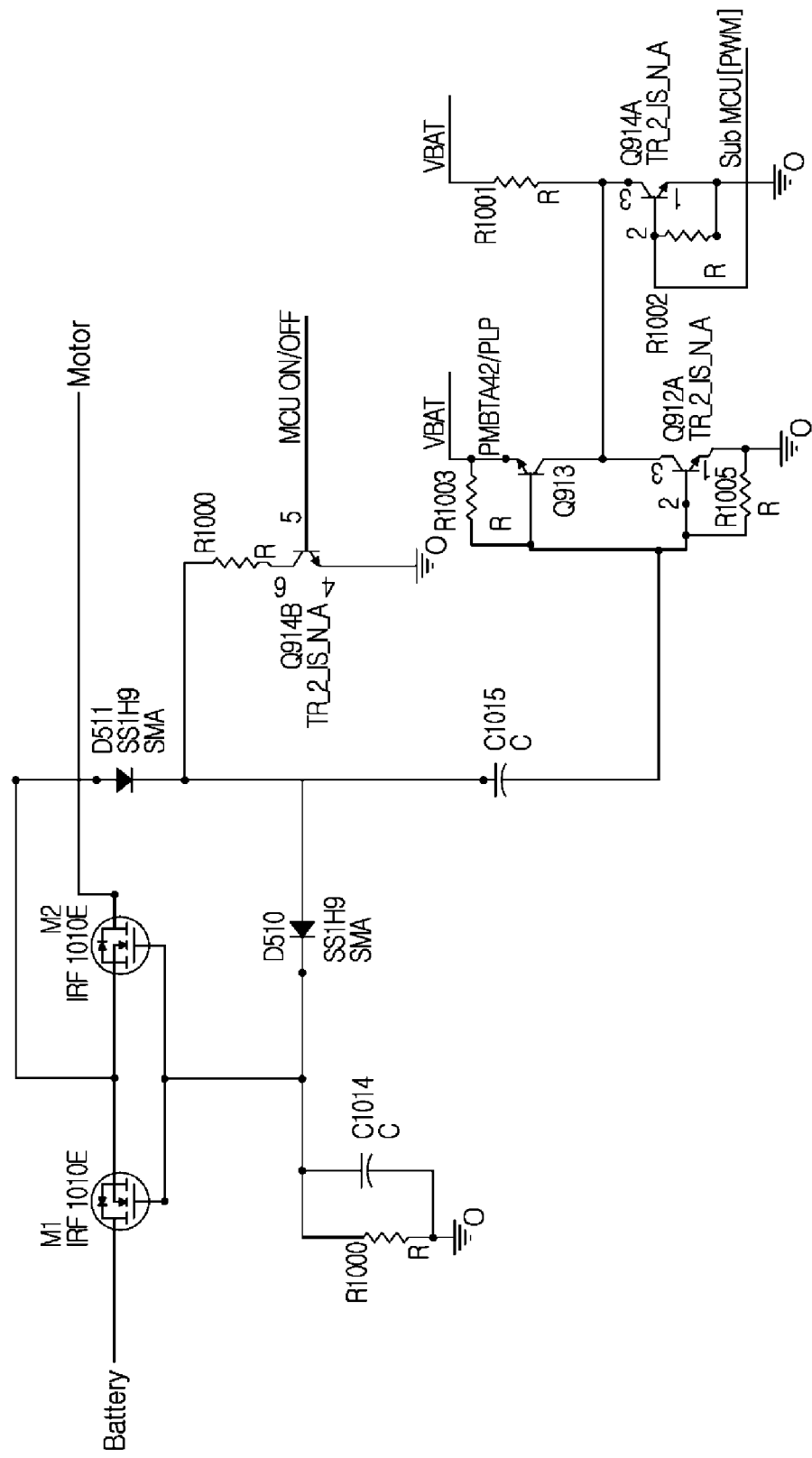
FIG. 1 is a diagram illustrating a representation of an example of a conventional electronic relay circuit.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. Like reference numerals in the drawings denote like elements.

Various advantages and features of the present invention and methods accomplishing thereof will become apparent from the following description of embodiments with reference to the accompanying drawings. However, the present invention is not be limited to the embodiments set forth herein but may be implemented in many different forms. The present embodiments may be provided so that the disclosure of the present invention will be complete, and will fully convey the scope of the invention to those skilled in the art and therefore the present invention will be defined within the scope of claims. Like reference numerals throughout the description denote like elements.

Unless defined otherwise, it is to be understood that all the terms (including technical and scientific terms) used in the specification has the same meaning as those that are understood by those who skilled in the art. Further, the terms defined by the dictionary generally used should not be ideally or excessively formally defined unless clearly defined specifically. It will be understood that for purposes of this disclosure, "at least one of X, Y, and Z" can be construed as X only, Y only, Z only, or any combination of two or more items X, Y, and Z (e.g., XYZ, XYY, YZ, ZZ). Unless particularly described to the contrary, the term "comprise", "configure", "have", or the like, which are described herein, will be understood to imply the inclusion of the stated components, and therefore should be construed as including other components, and not the exclusion of any other elements.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless is expressly so defined herein.

As is traditional in the corresponding field, some exemplary embodiments may be illustrated in the drawings in terms of functional blocks, units, and/or modules. Those of ordinary skill in the art will appreciate that these block, units, and/or modules are physically implemented by electronic (or optical) circuits such as logic circuits, discrete components, processors, hard-wired circuits, memory elements, wiring connections, and the like. When the blocks, units, and/or modules are implemented by processors or similar hardware, they may be programmed and controlled using software (e.g., code) to perform various functions discussed herein. Alternatively, each block, unit, and/or module may be implemented by dedicated hardware or as a combination of dedicated hardware to perform some functions and a processor (e.g., one or more programmed processors and associated circuitry) to perform other functions. Each block, unit, and/or module of some exemplary embodiments may be physically separated into two or more interacting and discrete blocks, units, and/or modules without departing from the scope of the inventive concept. Further, blocks, units, and/or module of some exemplary embodiments may be physically combined into more complex blocks, units, and/or modules without departing from the scope of the inventive concept.

Hereinbelow, an electronic relay device in accordance with an embodiment of the disclosure will be described with reference to attached drawings. It should be noted that the drawings are not to precise scale and may be exaggerated in thickness of lines or sizes of components for descriptive convenience and clarity only.

Furthermore, the terms as used herein are defined by taking functions of the invention into account and can be changed according to the custom or intention of users or operators. Therefore, definition of the terms should be made according to the overall is disclosures set forth herein.

Figure 2:
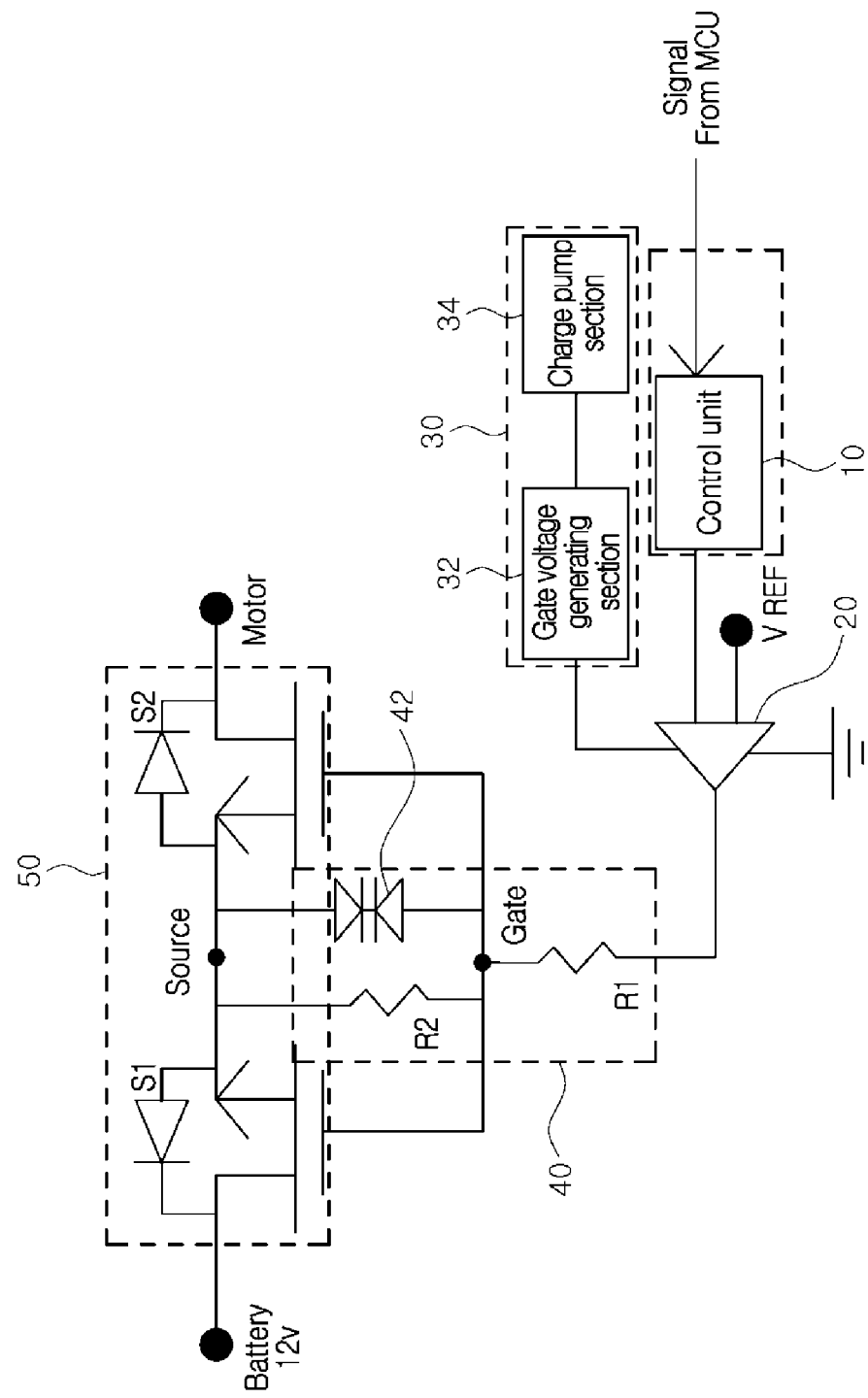
FIG. 2 is a diagram schematically illustrating a representation of an example of the circuit of an electronic relay device in accordance with an embodiment of the disclosure.
Figure 3:
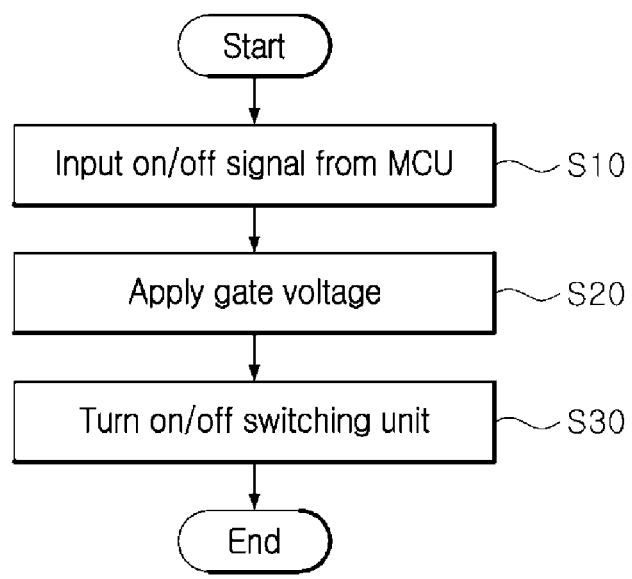
FIG. 3 is a representation of an example of a schematic flow chart to assist in the explanation of the electronic relay device in accordance with the embodiment of the disclosure.

FIG. 2 is a diagram schematically illustrating a representation of an example of the circuit of an electronic relay device in accordance with an embodiment of the disclosure, and FIG. 3 is a representation of an example of a schematic flow chart to assist in the explanation of the electronic relay device in accordance with the embodiment of the disclosure. The electronic relay device will be described below with reference to the drawings.

As illustrated in FIG. 2, the electronic relay device in accordance with the embodiment of the disclosure includes a controller 10, a comparison unit 20, a charging unit 30, a clamping unit 40, a switching unit 50, a first resistor R1 and a second resistor R2.

The controller 10 receives a relay turn-on/off signal from an MCU (micro controller) (not illustrated), and outputs an on/off control signal for switching driving. The controller 10 may output the control signal by being connected to a high (+) terminal of the comparison unit 20 to be described below.

The controller 10 may output the control signal of a voltage higher than a reference voltage of the comparison unit 20 when the turn-on signal is inputted from the MCU, and may output the control signal of a voltage lower than the reference voltage of the comparison unit 20 when the turn-off signal is inputted from the MCU. The controller 10 may include a function of outputting a stable output voltage to the comparison unit 20 even when an input voltage drifts.

The comparison unit 20 compares the reference voltage and a voltage of the control signal inputted from the controller 10, and thereby, outputs a signal of a corresponding state. That is to say, the comparison unit 20 may have a low (−) terminal to which a reference voltage generation element (not illustrated) is connected and the high (+) terminal to which the is controller 10 is connected.

Thus, if the turn-on signal is inputted to the controller 10 from the MCU, a voltage higher than the reference voltage may be applied from the controller 10 to the comparison unit 20, and the comparison unit 20 may output a high (+) signal. If the turn-off signal is inputted to the controller 10 from the MCU, a voltage lower than the reference voltage may be applied from the controller 10 to the comparison unit 20, and the comparison unit 20 may output a low (−) signal.

The charging unit 30 to be described below may be connected to a high (+) terminal of the comparison unit 20, and a ground (GND) may be connected to a low (−) terminal of the comparison unit 20. The comparison unit 20 may output a high signal, that is, a voltage supplied from the charging unit 30, when a voltage higher than the reference voltage is applied from the controller 10, and may output a low signal, that is, a voltage of 0V, when a voltage lower than the reference voltage is applied from the controller 10.

The charging unit 30 serves to provide a driving voltage for driving the switching unit 50 to be described below, in response to the control signal of the controller 10. The charging unit 30 includes a gate voltage generating section 32 and a charge pump section 34.

The gate voltage generating section 32 generates a gate voltage to be applied to the gate terminal of the switching unit 50.

The charge pump section 34 is to receive a battery voltage and generate a power source of a higher voltage.

Thus, the charging unit 30 may receive the battery voltage, pump charges, generate the gate voltage to be applied to the switching unit 50 and supply the gate voltage to the high (+) terminal of the comparison unit 20. For example, in the present embodiment, is considering that a maximum voltage of a battery is 24V, the charging unit 30 may supply the gate voltage of 30V to the comparison unit 20 such that, when the turn-on signal is inputted from the MCU, the gate voltage of 30V is applied to the gate terminal of the switching unit 50.

As illustrated in FIG. 2, in the present embodiment, the first resistor R1 is disposed between the output terminal of the comparison unit 20 and the gate terminal of the switching unit 50, and the second resistor R2 is disposed between the source terminal and the gate terminal of the switching unit 50 and is connected in parallel with the clamping unit 40 to be described below.

The clamping unit 40 may be disposed between the source terminal and the gate terminal of the switching unit 50, and thereby, may constantly maintain a voltage between the source terminal and the gate terminal in an on state of the switching unit 50.

The clamping unit 40 is formed such that two diodes are connected in series and the cathodes of the respective diodes are connected in common. In the present embodiment, zener diodes are used such that a voltage between the gate terminal and the source terminal of the switching unit 50 may be stably maintained.

The switching unit 50 includes a first switching element S1 and a second switching element S2 which are on/off-controlled in response to a driving signal from the charging unit 30 and supply power to a load. The source terminals of the first switching element 51 and the second switching element S2 are connected with each other, and the gate terminals of the first switching element 51 and the second switching element S2 are connected with each other. That is to say, in the present embodiment, the source terminal and the gate terminal of the switching unit 50 refer to a common source terminal and a common gate terminal through which the first switching element 51 and the second switching element S2 are connected with each other.

The first switching element 51 and the second switching element S2 are realized by N type MOSFETs, the drain terminal of the first switching element 51 is connected to a battery side, and the drain terminal of the second switching element S2 is connected to a load side. An N type MOSFET has a smaller internal resistance value than a P channel when being turned on, which is advantageous in terms of heat generation.

While FIG. 2 illustrates that the dotted line indicating the switching unit 50 does not include the gate terminal, it is to be noted that the gate terminal is included in the switching unit 50. Meanwhile, the second resistor R2 and the clamping unit 40 may also be included in the switching unit 50. In this case, the controller 10, the comparison unit 20, the charging unit 30 and the first resistor R1 may be broadly classified as a part for generating a driving voltage for driving the switching unit 50, and the clamping unit 40, the second resistor R2 and the switching unit 50 may be broadly classified as a switching part for switching.

In the present embodiment, as the clamping unit 40 is included, a voltage between the source terminal and the gate terminal may be constantly maintained in an on state of the switching unit 50. As a consequence, it is possible to turn on/off the switching unit 50 without relying on a source terminal voltage.

FIG. 3 is a representation of an example of a schematic flow chart to assist in the explanation of the electronic relay device in accordance with the embodiment of the disclosure. A process in which a relay turn-on/off signal is inputted from the MCU and the switching unit 50 is turned on/off will be described below.

As illustrated in FIG. 3, in an initial off state of the switching unit 50, if a turn-on signal is inputted from the MCU (S10), a high (+) signal is applied from the comparison unit 20 is through the first resistor R1 to the gate terminal of the switching unit 50 (S20), and the switching unit 50 is turned on as a threshold voltage is formed across the second resistor R2 (S30).

In the turn-on state of the switching unit 50, as a battery voltage is applied to the switching unit 50 and thus the battery voltage and the voltage of the source terminal of the switching unit 50 become the same, the high (+) signal of the comparison unit 20 is applied to the gate terminal of the switching unit 50 through the first resistor R1, and a voltage between the source terminal and the gate terminal of the switching unit 50 is constantly maintained through the clamping unit 40, by which the turn-on state of the switching unit 50 is maintained.

In other words, a process in which the switching unit 50 is turned on may be described as two steps. In an initial off state of the switching unit 50, if the relay turn-on signal is inputted from the MCU, the controller 10 outputs a control signal of a voltage higher than the reference voltage of the comparison unit 20, and thus, a voltage of, for example, 30V, is applied to the gate terminal of the switching unit 50 from the high (+) terminal, that is, the charging unit 30. In the initial state, since the switching unit 50 is in an off state, the voltage of the source terminal is in a floating state, and as a voltage is applied to the gate terminal, current passing through the first resistor R1 and the second resistor R2 flows through both paths which are formed through the body diodes of the switching unit 50. Thus, when a voltage across the second resistor R2 becomes, for example, about 5V, the switching unit 50 is turned on.

If the switching unit 50 is turned on, as the battery voltage is applied, the voltage of the source terminal and the battery voltage become the same. At this time, a gate voltage applied through the comparison unit 20, for example, a voltage of 16V, is clamped between the gate terminal and the source terminal of the switching unit 50 through the first resistor R1 and the clamping unit 40, as a stable voltage.

That is to say, in the conventional scheme in which a predetermined voltage is supplied to a gate terminal by recognizing the voltage of a source terminal to turn on a switching unit, if the voltage of the source terminal fluctuates by disturbance, the voltage of the gate terminal may also fluctuate, causing an unstable turn-on state. However, in the present embodiment, even though the voltage of the source terminal fluctuates, a voltage may be stably supplied between the gate terminal and the source terminal of the switching unit 50 by a clamping voltage through the clamping unit 40, whereby it is possible to stably maintain a relay turn-on state.

If a turn-off signal is inputted from the MCU (S10), a signal of the low (−) terminal of the comparison unit 20 is applied to the gate terminal of the switching unit 50 through the first resistor R1. Namely, as 0V is applied to the gate terminal, the switching unit 50 is turned off (S30).

As is apparent from the above descriptions, in the electronic relay device according to the embodiments of the disclosure, a voltage may be stably supplied between a source terminal and a gate terminal of a switching element by a clamping voltage. As a consequence, even when there occurs disturbance such as an unstable battery voltage, a turn-on state of the switching element may be stably maintained without relying on a source terminal voltage.

Although preferred embodiments of the disclosure have been disclosed for illustrative purposes, those skilled in the art will appreciate that various modifications, additions and substitutions are possible, without departing from the scope and spirit of the disclosure as defined in the accompanying claims. Thus, the true technical scope of the disclosure should be defined by the following claims.

What is claimed is:

1. An electronic relay device comprising:
   a controller configured to receive a signal from a micro controller (MCU), and to output an on/off control signal for switching driving;
   a charging unit configured to provide a driving voltage for driving a switch, in response to the control signal of the controller;
   the switch including a first switching element and a second switching element which supply power to a load by on/off-controlled in response to the driving voltage from the charging unit, source terminals of the first switching element and the second switching element being connected with each other and gate terminals of the first switching element and the second switching element being connected with each other; and
   a clamping unit disposed between one of the source terminals and one of the gate terminals, and configured to constantly maintain a voltage between the one of the source terminals and the one of the gate terminals in an on state of the switch.

2. The electronic relay device of claim 1, further comprising:
   a comparison unit configured to compare a reference voltage and a voltage of the control signal inputted from the controller, and to output a signal of a corresponding state.

3. The electronic relay device of claim 2, wherein, if a turn-on signal is inputted to the controller from the MCU, as a voltage higher than the reference voltage is applied from the controller to the comparison unit, the comparison unit is configured to output a high (+) signal, and if a turn-off signal is inputted to the controller from the MCU, as a voltage lower than the reference voltage is applied from the controller to the comparison unit, the comparison unit is configured to output a low (−) signal.

4. The electronic relay device of claim 3, wherein the charging unit is configured to receive a battery voltage, to pump charges, to generate a gate voltage to be applied to the switch, and to supply the gate voltage to a high (+) terminal of the comparison unit.

5. The electronic relay device of claim 4, further comprising:
   a first resistor disposed between an output terminal of the comparison unit and the gate terminals of the switch; and
   a second resistor disposed between the source terminals and the gate terminals of the switch, and connected in parallel with the clamping unit.

6. The electronic relay device of claim 5, wherein, in an initial off state of the switch, if the turn-on signal is inputted from the MCU, the high (+) signal of the comparison unit is applied through the first resistor to the gate terminals of the switch, and the switch is turned on as a threshold voltage is formed across the second resistor.

7. The electronic relay device of claim 6, wherein, in a turn-on state of the switch, as the battery voltage is applied to the switch thus the battery voltage and a voltage of the source terminal of the switch become the same, the high (+) signal of the comparison unit is applied to the gate terminals of the switch through the first resistor, and a voltage between the source terminals and the gate terminals of the switch is constantly maintained through the clamping unit, by which the turn-on state of the switch is maintained.

8. The electronic relay device of claim 1, wherein the first switching element and the second switching element are realized by N type metal oxide semiconductor field effect transistors (MOSFETs), a drain terminal of the first switching element is connected to a battery side, and a drain terminal of the second switching element is connected to a load side.

9. The electronic relay device of claim 1, wherein the clamping unit is formed such that two diodes are connected in series and cathodes of the respective diodes are connected in common.

* * * * *